(12) United States Patent
Daigo (10) Patent No.: US 10,224,463 B2
(45) Date of Patent: Mar. 5, 2019

(54) FILM FORMING METHOD, METHOD OF MANUFACTURING SEMICONDUCTOR LIGHT-EMITTING DEVICE, SEMICONDUCTOR LIGHT-EMITTING DEVICE, AND ILLUMINATING DEVICE

(71) Applicant: CANON ANELVA CORPORATION, Kawasaki-shi (JP)

(72) Inventor: Yoshiaki Daigo, Kawasaki (JP)

(73) Assignee: CANON ANELVA CORPORATION, Kawasaki-Shi (JP)

( * ) Notice: Subject to any disclaimer, the term of this patent is extended or adjusted under 35 U.S.C. 154(b) by 0 days.

(21) Appl. No.: 14/791,543

(22) Filed: Jul. 6, 2015

(65) Prior Publication Data

US 2015/0311399 A1 Oct. 29, 2015

Related U.S. Application Data

(63) Continuation of application No. PCT/JP2014/001012, filed on Feb. 26, 2014.

(30) Foreign Application Priority Data

Mar. 14, 2013 (JP) .................................. 2013-052206

(51) Int. Cl.
*H01L 33/00* (2010.01)
*H01L 33/44* (2010.01)
(Continued)

(52) U.S. Cl.
CPC .......... *H01L 33/44* (2013.01); *C23C 14/0617* (2013.01); *C23C 14/34* (2013.01);
(Continued)

(58) Field of Classification Search
CPC ......... H01L 33/12; H01L 33/32; H01L 33/44; H01L 33/005; H01L 21/02581;
(Continued)

(56) References Cited

U.S. PATENT DOCUMENTS 8,492,186 B2 7/2013 Shinohara et al.
2002/0110945 A1* 8/2002 Kuramata .............. B82Y 20/00
438/36
(Continued)

FOREIGN PATENT DOCUMENTS

JP 11-121801 A 4/1999
JP 2011-329971 A 11/1999
(Continued)

OTHER PUBLICATIONS

Official Letter dated Jul. 13, 2015 issued in Taiwan Patent Application No. 103107672 (4 pages).
(Continued)

*Primary Examiner* — Hoang-Quan Ho
*Assistant Examiner* — Quovaunda V Jefferson
(74) *Attorney, Agent, or Firm* — Venable LLP (57) ABSTRACT

An object of the present invention is to provide a film formation technique having high productivity by realizing a foundation layer having excellent crystallinity with a small film thickness of about 2 μm. An embodiment of the present invention relates to a film forming method which includes the step of forming a buffer layer by sputtering on a sapphire substrate held by a substrate holder. The buffer layer includes an epitaxial film having a wurtzite structure prepared by adding at least one substance selected from the group consisting of C, Si, Ge, Mg, Zn, Mn, and Cr to $Al_xGa_{1-x}N$ (where $0 \le x \le 1$).

9 Claims, 3 Drawing Sheets

(51) Int. Cl.
  *H01L 33/12* (2010.01)
  *H01L 21/02* (2006.01)
  *C30B 23/02* (2006.01)
  *C30B 29/40* (2006.01)
  *C23C 14/06* (2006.01)
  *C23C 14/34* (2006.01)
  *H01L 33/32* (2010.01)

(52) U.S. Cl.
  CPC .......... *C30B 23/025* (2013.01); *C30B 29/403* (2013.01); *H01L 21/0242* (2013.01); *H01L 21/0254* (2013.01); *H01L 21/02458* (2013.01); *H01L 21/02573* (2013.01); *H01L 21/02581* (2013.01); *H01L 33/005* (2013.01); *H01L 33/007* (2013.01); *H01L 33/12* (2013.01); *H01L 33/32* (2013.01); *H01L 2221/00* (2013.01); *H01L 2933/0025* (2013.01)

(58) Field of Classification Search
  CPC ........... H01L 21/0242; H01L 21/02458; H01L 21/0254; H01L 21/02573; C23C 14/34; C23C 14/0617
  See application file for complete search history.

(56) References Cited

U.S. PATENT DOCUMENTS

| | | | | |
|---|---|---|---|---|
| 2005/0045101 | A1* | 3/2005 | Ishihara | C23C 14/50 118/719 |
| 2009/0308635 | A1* | 12/2009 | Yano | C04B 35/453 174/126.1 |
| 2010/0244086 | A1* | 9/2010 | Hanawa | H01L 21/02458 257/103 |
| 2012/0146191 | A1* | 6/2012 | Yasuhara | C23C 16/303 257/615 |
| 2013/0049064 | A1 | 2/2013 | Daigo et al. | |
| 2013/0277206 | A1 | 10/2013 | Daigo et al. | |
| 2014/0225154 | A1 | 8/2014 | Daigo | |
| 2015/0102371 | A1 | 4/2015 | Daigo | |

FOREIGN PATENT DOCUMENTS

| | | | | |
|---|---|---|---|---|
| JP | 2001-308010 | * | 11/2001 | |
| JP | 2003-101157 | A | 4/2003 | |
| JP | 2003-101167 | A | 4/2003 | |
| JP | 2003-221662 | * | 8/2003 | |
| JP | 2003-221662 | A * | 8/2003 | ............ H01L 33/00 |
| JP | 2011-82570 | A | 4/2011 | |
| TW | I264835 | B | 10/2006 | |
| TW | I385822 | | 2/2013 | |

OTHER PUBLICATIONS

International Search Report issued in PCT/JP2014/001012, dated May 13, 2014 (1 page).
S.M. Sze, "Semiconductor Devices: Physics and Technology" 1st ed., (1985) pp. 21-22, 316-320.
"Lecture Materials of Electronic Device Engineering", National Institute of Technology, Akita College, available at: http://akita-nct.jp/~tanaka/kougi/2007nen/3e/1-5defect.pdf, May 8, 2007.
Office Action dated Jun. 28, 2016, issued in counterpart Korean patent application No. 10-2015-7019176 (8 pages).
A. Asami et al., "Growth of Si or MG-doped GaN single-crystalline layer by UHV sputtering method," Extended Abstrac1 of the 66th Meeting of the Japan Society of Applied Physics, Japan, Japan Society of Applied Physics, 2005, vol. 1, p. 248.

* cited by examiner

FILM FORMING METHOD, METHOD OF MANUFACTURING SEMICONDUCTOR LIGHT-EMITTING DEVICE, SEMICONDUCTOR LIGHT-EMITTING DEVICE, AND ILLUMINATING DEVICE

CROSS-REFERENCES TO RELATED APPLICATIONS

This application is a continuation application of International Application No. PCT/JP2014/001012, filed Feb. 26, 2014, which claims the benefit of Japanese Patent Application No. 2013-052206 filed Mar. 14, 2013. The contents of the aforementioned applications are incorporated herein by reference in their entireties.

TECHNICAL FIELD

The present invention relates to a film forming method, a method of manufacturing a semiconductor light-emitting device, a semiconductor light-emitting device, and an illuminating device.

BACKGROUND ART

Metal organic chemical vapor deposition (MOCVD) has been used in epitaxial growth of group III nitride semiconductor thin films for the reason that the MOCVD tends to achieve high productivity. Although conventional group III nitride semiconductor thin films grown by the MOCVD would be mostly of low quality having threading dislocation densities in a range from the upper half of the $10^9$ cm$^{-2}$ order to the $10^{10}$ cm$^{-2}$ order, high-quality single-crystal films thereof have been becoming available with advances in technical developments in recent years. For example, in blue LEDs currently available in the market, the threading dislocation density has been successfully reduced to about $1 \times 10^9$ cm$^{-2}$ in the case of crystal growth of a group III nitride semiconductor thin film in the thickness of about 5 to 10 μm on a sapphire substrate having a flat surface. This threading dislocation density is significantly larger value than those of other compound semiconductor devices. Nevertheless, this value represents quite fine crystallinity as the group III nitride semiconductor thin film, which is formed on the sapphire substrate having the flat surface and is used for a blue LED.

Considering further improvements in device properties in the future, a group III nitride semiconductor thin film is desired to achieve a threading dislocation density of about $5 \times 10^8$ cm$^{-2}$, or is even more desired to have a threading dislocation density of about $1 \times 10^8$ cm$^{-2}$. However, on the sapphire substrate having the flat surface, it is difficult to reduce the threading dislocation density to about $5 \times 10^8$ cm$^{-2}$, and it is even more difficult to further reduce the threading dislocation density to about $1 \times 10^8$ cm$^{-2}$. In this regard, an approach to reduce the threading dislocation density, for example, by using any of a sapphire substrate provided with irregularities on its surface and a silicon carbide substrate is currently under study. However, the use of the substrates mentioned above is likely to cause a problem of an increase in cost of the substrates.

In the meantime, another method is currently under study which obtains a high-quality group III nitride semiconductor thin film by forming a buffer layer made of an AlN film and deposited by sputtering on a sapphire substrate, and forming a foundation layer made of group III nitride semiconductor thereon by the MOCVD (Patent Document 1, for example).

Patent Document 1 discloses that an oxygen content of less than 1% in the buffer layer made of the AlN film improves lattice match between the sapphire substrate and the buffer layer, improves orientation of the buffer layer, and consequently improves crystallinity of the group III nitride semiconductor thin film formed on the buffer layer. Patent Document 1 also discloses that, in order to form a foundation layer (which is group III nitride semiconductor containing Ga according to Patent Document 1) with fine crystallinity on the buffer layer made of the AlN film that contains less than 1% of oxygen, the film thickness of the foundation layer is preferably set in a range from 0.1 to 8 μm, or preferably set in a range from 0.1 to 2 μm from the viewpoint of its productivity.

CITATION LIST

Patent Document

Patent Document 1: Japanese Patent Application Laid-Open No. 2011-82570

SUMMARY OF INVENTION

Technical Problems

Patent Document 1 discloses that the foundation layer with fine crystallinity can be obtained by forming the foundation layer made of the group III nitride semiconductor thin film on the buffer layer made of the AlN film and containing less than 1% of oxygen, while setting the film thickness of the foundation layer in the range from 0.1 to 8 μm. However, there is no disclosure concerning a relation between the crystallinity and the film thickness of the foundation layer when the film thickness of the foundation layer is in the range from 0.1 to 8 μm.

According to a verification test conducted on the invention described in Patent Document 1 by the inventors of the present application, the crystallinity of the foundation layer is excellent when its film thickness is equal to or above 5 μm. This is a result from a phenomenon where the density of threading dislocation propagated to the surface of the foundation layer is reduced because a dislocation occurring at an interface between the sapphire and the buffer layer or between the buffer layer and the foundation layer is bent during the growth of the foundation layer with increase in the film thickness thereof.

Meanwhile, according to Patent Document 1, high productivity can be achieved by forming the foundation layer made of the group III nitride semiconductor thin film on the buffer layer made of the AlN film that contains less than 1% of oxygen, and setting the film thickness of the foundation layer in the range from 0.1 to 2 μm. As mentioned above, according to the verification test conducted on the invention disclosed in Patent Document 1 by the inventors of the present application, the foundation layer with the film thickness of 2 μm has fine crystallinity with its threading dislocation density around $1 \times 10^9$ cm$^{-2}$. However, by forming the foundation layer in the thickness of 5 μm or above, it is possible to achieve the threading dislocation density of about $5 \times 10^8$ cm$^{-2}$ or even less, so that the group III nitride semiconductor thin film with even finer crystallinity can be obtained. In other words, in order to obtain the foundation layer having the excellent crystallinity with the threading dislocation density around $5 \times 10^8$ cm$^{-2}$ or below by using the technique disclosed in Patent Document 1, the film thickness of the foundation layer needs to be equal to or above 5 μm.

Accordingly, there is a problem of a significant loss in productivity associated with a longer period of time required for forming that foundation layer.

In addition, the technique described in Patent Document 1 has the following trade-off relation. Specifically, although a lattice mismatch ratio at the AlN/sapphire interface can be reduced, a lattice mismatch ratio between a GaN layer (the foundation layer made of the group III nitride semiconductor thin film) and the AlN film (the buffer layer) is increased on the other hand. For this reason, according to the technique described in Patent Document 1, although the dislocation of the foundation layer attributed to the orientational disorder of the buffer layer can be suppressed, it is difficult to suppress the dislocation caused by the lattice mismatch at the GaN/AlN interface. In order to solve the dislocation caused by the lattice mismatch at the GaN/AlN interface, the film thickness of the foundation layer needs to be increased, for example, to 5 µm or above as described previously. In other words, only by use of the technique described in Patent Document 1, it is difficult to keep the foundation layer made of the group III nitride semiconductor thin film as thin as about 2 µm, and to maintain the favorable threading dislocation density of the foundation layer at the same time.

The present invention has been made in view of the aforementioned problems, and an object thereof is to provide a film formation technique that has high productivity by realizing a foundation layer having excellent crystallinity with a small film thickness of about 2 µm. Another object of the present invention is to provide a film formation technique capable of forming a foundation layer with a favorable threading dislocation density.

Solution to Problem

As a result of earnest research, the inventors of the present application have found out that crystallinity of a foundation layer to be formed on a buffer layer, which is formed on a sapphire substrate and has $Al_xGa_{1-x}N$ (where $0 \leq x \leq 1$) as a main phase, can be improved by adding C or the like to the buffer layer, and have thus accomplished the present invention.

An aspect of the present invention provides a film forming method which includes the step of forming a buffer layer by sputtering on a sapphire substrate held by a substrate holder. Here, the buffer layer includes an epitaxial film having a wurtzite structure prepared by adding at least one substance selected from a group consisting of C, Si, Ge, Mg, Zn, Mn, and Cr to $Al_xGa_{1-x}N$ (where $0 \leq x \leq 1$).

By forming the foundation layer including the group III nitride semiconductor thin film on the buffer layer formed by the above-described film forming method, it is possible to obtain the foundation layer having crystallinity equivalent to that of the foundation layer with the thickness equal to or above 5 µm formed by using the technique described in Patent Document 1. In other words, it is possible to maintain the fine crystallinity of the foundation layer with the thickness of about 2 µm. Thus, it is possible to obtain the high-quality group III nitride semiconductor thin film at high productivity.

In the above-described film forming method, it is more desirable that the substrate holder include a heater capable of heating the sapphire substrate to a desired temperature, and that the buffer layer be formed on the sapphire substrate in a state where the sapphire substrate is held at a predetermined distance from a substrate-facing surface of the substrate holder.

Meanwhile, another aspect of the present invention provides a method of manufacturing a semiconductor light-emitting element which includes the steps of: forming a buffer layer on a sapphire substrate by sputtering, the buffer layer including an epitaxial film having a wurtzite structure; forming a foundation layer on the buffer layer; and forming a light-emitting layer on the foundation layer. Here, the buffer layer is formed by the above-described film forming method.

Advantageous Effects of Invention

According to the present invention, the foundation layer with excellent crystallinity can be realized with a film thickness below 5 µm, or about 2 µm, for example. Thus, it is possible to provide the technique which has high productivity by reducing time required for forming the foundation layer. Moreover, according to the present invention, it is possible to provide the technique capable of forming the foundation layer with the favorable threading dislocation density.

DESCRIPTION OF EMBODIMENTS

The present invention will be described below with reference to the drawings. It is to be noted that components, layouts, and the like described below constitute a mere example to embody the present invention and are therefore not intended to limit the present invention. Naturally, various modifications are possible in accordance with the gist of the present invention.

Figure 1:
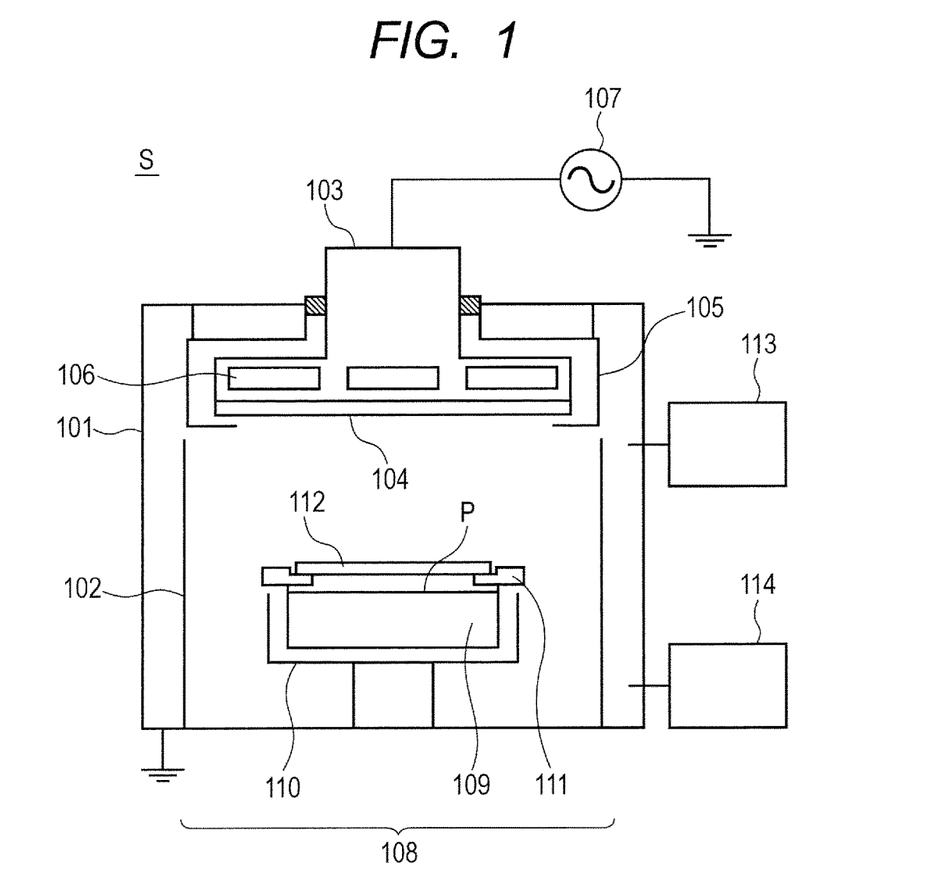
FIG. 1 is a schematic configuration diagram of a sputtering apparatus used for film formation of a buffer layer according to the present invention.

FIG. 1 is a schematic configuration diagram of a sputtering apparatus S used for film formation of a buffer layer according to an embodiment of the present invention. Here, reference numeral 101 denotes a vacuum chamber, reference numeral 102 denotes a chamber shield, reference numeral 103 denotes a sputtering cathode, reference numeral 104 denotes a sputtering target, reference numeral 105 denotes a target shield, reference numeral 106 denotes a magnet unit, reference numeral 107 denotes a sputtering power supply, reference numeral 108 denotes a substrate holder, reference numeral 109 denotes a heater, reference numeral 110 denotes a reflector, reference numeral 111 denotes a substrate mounting mechanism, reference numeral 112 denotes a sapphire substrate, reference numeral 113 denotes a process gas supply unit, and reference numeral 114 denotes an evacuation unit, respectively.

The vacuum chamber 101 is formed from a metal member such as an Al alloy and SUS. The inside of the vacuum chamber 101 can be kept at a high vacuum by the evacuation unit 114. The chamber shield 102 is a member capable of suppressing adhesion of a film onto the vacuum chamber 101, and is formed from a metal member such as SUS and a nickel alloy which can withstand a relatively high temperature. The sputtering cathode 103 is electrically insulated from the vacuum chamber 101 and plays a role in supplying electric power that is inputted from the sputtering power supply 107 to the sputtering target 104. The sputtering target 104 is attached to the sputtering cathode 103 through a not-illustrated bonding plate. The sputtering target 104 is prepared by homogeneously dispersing at least one element out of C, Si, Ge, Mg, Zn, Mn, and Cr at a concentration equal to or below 5 at % into either Al metal or an AlGa alloy.

The target shield 105 is formed from a metal member such as an Al alloy and SUS. The magnet unit 106 is built in the sputtering cathode 103, and realizes magnetron sputtering by generating a magnetic field on a surface of the target 104. The sputtering power supply 107 supplies the electric power to the sputtering cathode 103 to generate plasma, and thus brings about a sputtering phenomenon. Here, a 13.56-MHz radio-frequency (RF) power supply is preferably used as the sputtering power supply 107. In the meantime, the power supply may adopt a method of superposing the RF power and direct-current (DC) power by combining the 13.56-MHz RF power supply and a DC power supply, or may adopt a power supply which can convert the 13.56-MHz RF power and thus supply electric power in the form of pulses at a lower frequency. Furthermore, it is also possible to use a power supply that operates at 60 MHz or other frequencies. The substrate holder 108 is formed from the heater 109, the reflector 110, and the substrate mounting mechanism 111. Pyrolytic graphite (PG) or the PG coated with pyrolytic boron nitride (PBN), which can efficiently heat a substrate to a desired temperature, is preferably used as the heater 109.

Here, PG has a function as a heater electrode, and the heater 109 plays a role as a heating element by feeding a DC or AC current to the heater electrode formed from PG. The reflector 110 is made of molybdenum, PBN, or the like and is used for efficiently heating the heater 109. The substrate mounting mechanism 111 is formed from an insulating member such as quartz, and holds the sapphire substrate 112 at its outer peripheral portion. Here, the substrate mounting mechanism 111 holds the sapphire substrate 112 away by a predetermined distance from a surface P (a substrate-facing surface) of the substrate holder 108 (the heater 109). In this way, a buffer layer of +c polarity is obtained more easily. The sapphire substrate 112 with a surface having c plane ((0001) plane) is preferably used. Alternatively, an off-substrate having c axis inclined from a normal direction of the substrate may be used as the sapphire substrate 112.

Here, if the sapphire substrate 112 is a small-diameter substrate, then the substrate may be mounted on a tray made of an insulating material such as quartz. The process gas supply unit 113 includes a not-illustrated mass flow controller and a not-illustrated process gas supply source, and introduces a rare gas as well as a nitrogen-containing gas into the vacuum chamber 101 each at a predetermined flow rate. Here, Ar is preferably used as the rare gas and $N_2$ is preferably used as the nitrogen-containing gas. The evacuation unit 114 includes a main exhaust pump such as a turbomolecular pump (TMP) and a cryopump, and a roughing pump (an auxiliary pump) such as a dry pump. The inside of the vacuum chamber 101 can be evacuated by using these vacuum pumps.

Procedures to form the buffer layer according to the embodiment are as follows. First, the sapphire substrate 112 is introduced into a not-illustrated load-lock mechanism. After the load-lock mechanism is evacuated to establish a vacuum state, the sapphire substrate 112 is conveyed into the sputtering apparatus S shown in FIG. 1 through a not-illustrated vacuum conveyance mechanism. The sapphire substrate 112 conveyed into the sputtering apparatus S is disposed on the substrate mounting mechanism 111. Thereafter, the rare gas and the nitrogen-containing gas each at the predetermined flow rate are introduced into the vacuum chamber 101 by using the process gas supply unit 113 and the electric power is supplied to the sputtering target 104, thereby generating the plasma inside the vacuum chamber 101. The electric power is supplied from the sputtering power supply 107 to the sputtering target 104 through the sputtering cathode 103.

Of positive ion components in the generated plasma, those entering a cathode sheath are attracted to the target 104 by a negative electric voltage applied to the surface of the target 104 and hit the target 104, thereby bringing about the sputtering phenomenon. The activated nitrogen existing in the gas phase reacts with the target constituent elements, which are discharged from the target by the above-described sputtering phenomenon, on the surface of the target, in the gas phase, or on the surface of the substrate. Thus, the buffer layer according to the embodiment is formed. Here, a not-illustrated RF bias electrode may be disposed inside the heater 109 or at an outer peripheral portion of the substrate mounting mechanism 111, and the substrate may be subjected to a pretreatment with the plasma generated by the RF bias electrode in the nitrogen-containing atmosphere, before the formation of the buffer layer according to the embodiment.

When Al is used as the target, an in-plane lattice constant of the buffer layer of this embodiment in the vicinity of an interface between the buffer layer and the sapphire substrate, the buffer layer being formed on the sapphire substrate as an epitaxial film having a wurtzite structure, is not significantly different from that of a buffer layer formed in accordance with a publicly known technique (see Patent Document 1, for example). Moreover, there is no significant difference in terms of orientation between these buffer layers either. In other words, the lattice match of the buffer layer of this embodiment is not different from that of the buffer layer of the publicly known technique. As a result, no significant difference in orientation is thought to be present therebetween either. Note that detailed explanation of the orientation will be described later.

On the other hand, an in-plane lattice constant of the buffer layer of this embodiment in the vicinity of its surface becomes higher than the in-plane lattice constant of the buffer layer in the vicinity of the interface between the buffer layer and the sapphire substrate. Moreover, the in-plane lattice constant of the buffer layer of this embodiment in the vicinity of its surface is also higher than an in-plane lattice constant of the buffer layer of the publicly known technique in the vicinity of its surface. Furthermore, a ratio of +c polarity in the vicinity of the surface of the buffer layer of this embodiment becomes higher than a ratio of +c polarity in the vicinity of the surface of the buffer layer of the publicly known technique.

In other words, the buffer layer of this embodiment is significantly lattice relaxed from the interface between the buffer layer and the sapphire toward its surface side, and the ratio of the +c polarity is also high. On the other hand, in the buffer layer of the publicly known technique, the above-described lattice relaxation is small and the ratio of the +c polarity is also low. Furthermore, there seems to be little difference in orientation between the buffer layer of this embodiment and the buffer layer of the publicly known technique.

As described above, the large lattice relaxation from the interface between the buffer layer and the sapphire toward the surface side in the buffer layer of this embodiment is thought be attributed to the following reason. Specifically, by using the buffer layer of the wurtzite crystal structure formed from any of $Al_xGa_{1-x}N:C$, $Al_xGa_{1-x}N:Si$, $Al_xGa_{1-x}N:Ge$, $Al_xGa_{1-x}N:Mg$, $Al_xGa_{1-x}N:Zn$, $Al_xGa_{1-x}N:Mn$, and $Al_xGa_{1-x}N:Cr$ (in which the symbol ":" represents a mixture of the substance described on the left side and the substance described on the right side) (where $0 \leq x \leq 1$, and the percentage of any of the substances C, Si, Ge, Mg, Zn, Mn, and Cr in total to the entire buffer layer is equal to or below 5 at %), any of the substances C, Si, Ge, Mg, Zn, Mn, and Cr mentioned above does not enter lattice points of the wurtzite crystal that constitutes the parent material but instead enters lattice interstices thereof, thereby bringing about the lattice relaxation relatively easily. Here, it is essential that the percentage of any of C, Si, Ge, Mg, Zn, Mn, and Cr to the entire buffer layer is equal to or below 5 at %. Setting the percentage higher than 5 at % leads to significant deterioration in orientation and is therefore not preferable. In the meantime, the ratio of the +c polarity of the buffer layer of this embodiment tends to be higher than that of the publicly known technique. This is an effect of holding the sapphire substrate 112 away from the substrate-facing surface of the substrate holder 108 as shown in FIG. 1. The use of the buffer layer having the above-described +c polarity is thought to be another reason why the lattice relaxation is easily brought about.

When the buffer layer having the high ratio of the +c polarity is used as in this embodiment, crystal discontinuity in the in-plane direction is improved as compared to a buffer layer that includes both a +c polarity domain and a −c polarity domain. In other words, relaxation of strain to be accumulated in the entire buffer layer at an inversion boundary is less likely to occur, whereby each of the domains is thought to be more likely to bring about the lattice relaxation. On the other hand, the buffer layer formed from the AlN film and provided with the lower ratio of the +c polarity includes both the +c polarity domain and the −c polarity domain, and crystal discontinuity in the in-plane direction, being an inversion boundary, is likely to occur at interfaces therebetween. Since the inversion boundaries exist at a high density, the strain to be accumulated at the inversion boundaries of the entire buffer layer is relaxed, whereby the lattice strain to be accumulated in each of the domains is thought to become relatively small. In other words, it is anticipated that each of the domains is less likely to be lattice relaxed.

Note that it is not essential to obtain the buffer layer having the high ratio of the +c polarity in the present invention, because the lattice relaxation is more likely to be brought about by using the buffer layer of the wurtzite crystal structure formed from any of $Al_xGa_{1-x}N:C$, $Al_xGa_{1-x}N:Si$, $Al_xGa_{1-x}N:Ge$, $Al_xGa_{1-x}N:Mg$, $Al_xGa_{1-x}N:Zn$, $Al_xGa_{1-x}N:Mn$, and $Al_xGa_{1-x}N:Cr$. However, it is preferable to perform the control in such a way as to increase the ratio of the +c polarity by holding the sapphire substrate 112 away from the substrate-facing surface of the substrate holder 108, since the lattice relaxation can be easily achieved as a consequence.

Meanwhile, there is also a problem that it is difficult to obtain the foundation layer made of the group III nitride semiconductor thin film with high crystalline quality if it is not possible to control the orientation of the buffer layer to the +c polarity. However, there is a possibility to avoid such a problem by significantly improving the film forming method and film forming conditions for the foundation layer, because a growth speed of the +c polarity in the foundation layer (a GaN film) is generally faster than that of the −c polarity, and it is therefore likely that the top of one of domains of the foundation layer oriented to the −c polarity by inheriting the polarity of the buffer layer is covered with another domain of the foundation layer oriented to the +c polarity. For this reason, the effect of the present invention is achieved even if the control of the orientation of the buffer layer to the +c polarity is failed. However, the capability of controlling the orientation of the buffer layer to the +c polarity represents a preferred aspect since it is quite difficult in general to grow the foundation layer in the above-described manner.

Next, a mode of forming the foundation layer made of the group III nitride semiconductor on the buffer layer according to the embodiment will be described. First, the sapphire substrate provided with the buffer layer by the sputtering according to the embodiment is taken out of the sputtering apparatus S to the atmosphere, and is then introduced into a reactor of an MOCVD apparatus. The sapphire substrate introduced into the reactor of the MOCVD apparatus is heated to a predetermined temperature. Thereafter, a raw material gas such as ammonia ($NH_3$) and trimethylgallium (TMG) is supplied into the reactor together with a carrier gas such as hydrogen ($H_2$). Thus, the foundation layer made of the group III nitride semiconductor can be formed.

Here, the buffer layer according to the embodiment has the same degree of the lattice match at the interface portion between the buffer layer and the sapphire substrate as that of the buffer layer made of the AlN film and formed in accordance with the publicly known technique. For this reason, the buffer layer according to the embodiment has the same degree of the orientation as that of the buffer layer formed in accordance with the publicly known technique. On the other hand, in the buffer layer according to the embodiment, the lattice relaxation is likely to be brought about more than in the case of the publicly known buffer layer, and lattice mismatch occurring in the buffer layer of the embodiment at the interface between the foundation layer and the buffer layer becomes smaller as a consequence.

Accordingly, the foundation layer formed on the buffer layer by the above-described method causes less dislocation at the interface between the foundation layer and the buffer layer than that occurring in the foundation layer obtained in accordance with the publicly known technique. Meanwhile, the dislocation of the foundation layer of this embodiment attributed to the disarray in the orientation of the buffer layer becomes the same degree as that of the buffer layer according to the publicly known technique. For this reason, by using the buffer layer of this embodiment and forming the foundation layer made of the group III nitride semiconductor thin film on the buffer layer, the threading dislocation occurring in the foundation layer with its film thickness reduced to 2 μm still becomes almost equal to that in the case of forming the foundation layer in the thickness of 5 μm in accordance with the publicly known technique. As a result, time required for the film formation is reduced and the group III nitride semiconductor is formed at high productivity.

Here, as for a method of manufacturing a semiconductor light-emitting element by using this embodiment, the foundation layer made of the group III nitride semiconductor thin film is formed on the buffer layer, and then an n-type group III nitride semiconductor layer doped with a small amount of an impurity element such as Si, light-emitting layers formed from a multiple quantum well structure using InGaN and GaN, and an p-type group III nitride semiconductor layer doped with a small amount of an impurity element such as Mg are sequentially laminated in this order. Thus, an epitaxial wafer made of the group III nitride semiconductor is formed. Thereafter, the epitaxial wafer is subjected to lithography and RIE, whereby a translucent electrode, a p-type bonding pad electrode, and the like which are well known are formed on the p-type group III nitride semiconductor layer, while well-known n-type electrode is formed on the n-type group III nitride semiconductor layer. And finally, a well-known protection film is formed.

Specifically, it is possible to use ITO (indium-tin-oxide) as the translucent electrode, to use a structure formed by laminating titanium (Ti), Al, and gold (Au) as the p-type bonding pad electrode, to use a structure formed by laminating nickel (Ni), Al, Ti, and Au as the n-type electrode, and to use $SiO_2$ as the protection film. Meanwhile, the wafer provided with the LED structure thus formed is scribed into 350-μm LED chips. Then, each LED chip is mounted on a lead frame and bonded to the lead frame by using gold wires. Thus, an LED element is formed. Furthermore, an illuminating device and the like can be formed by using such LED elements.

Figure 2A:
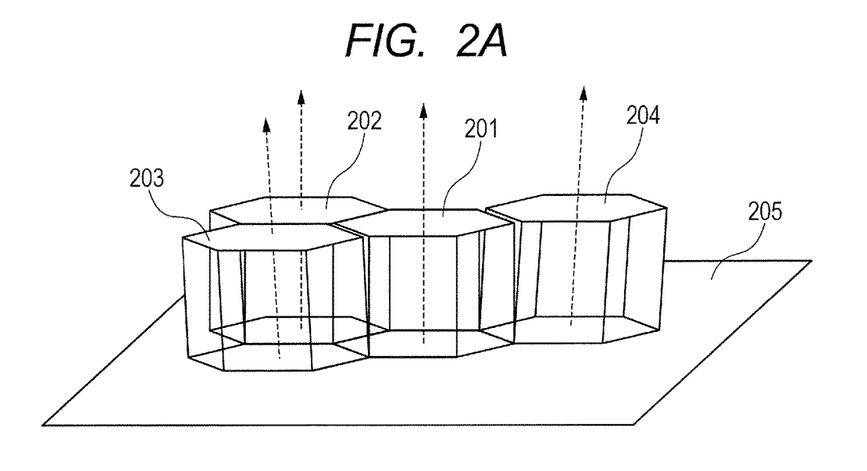
FIG. 2A is a conceptual diagram explaining tilt mosaic spread in the buffer layer according to the present invention.
Figure 2B:
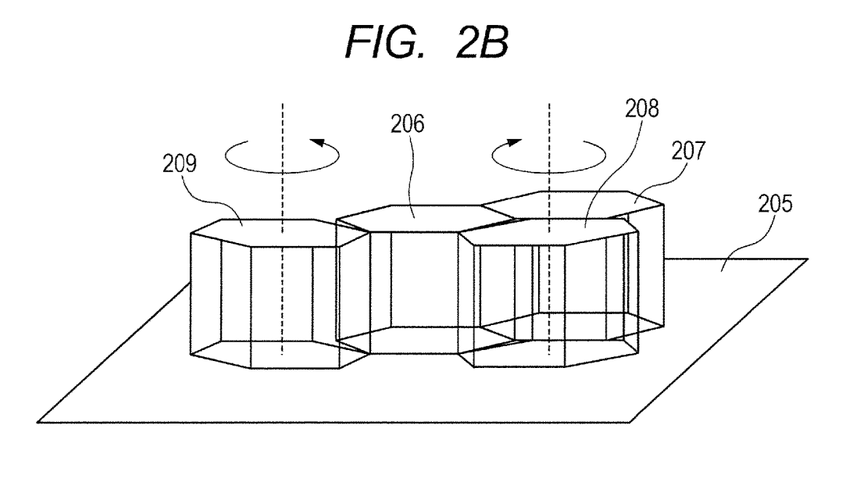
FIG. 2B is a conceptual diagram explaining twist mosaic spread in the buffer layer according to the present invention.

Next, a concept of the orientation described in this specification will be briefly explained by using FIGS. 2A and 2B. FIGS. 2A and 2B illustrate conceptual diagrams of tilt mosaic spread (deviation of crystallographic orientation in the direction perpendicular to the substrate) and twist mosaic spread (deviation of crystallographic orientation in the in-plane direction) as indices to represent the orientation of the buffer layer. FIG. 2A is the diagram explaining the tilt mosaic spread in the buffer layer formed on the sapphire substrate. Reference numerals 201 to 204 denote domain structures in the wurtzite crystal structure constituting the buffer layer, and represent a state in which all of the domain structures are c-axis oriented. Reference numeral 205 denotes a sapphire substrate. The orientations of the c axes of the domains 201 and 202 are aligned with each other and constitute the main crystallographic orientation of the c axis in the buffer layer. On the other hand, the orientations of the c axes of the domain 203 and the domain 204 are each slightly inclined with respect to the orientations of the c axes of the domains 201 and 203.

Meanwhile, FIG. 2B is the diagram explaining the twist mosaic spread in the buffer layer formed on the sapphire substrate. Reference numerals 206 to 209 denote domain structures in the wurtzite crystal structure of the c-axis orientation constituting the above-described buffer layer. The orientations of a axes (crystallographic orientations in the in-plane direction) of the domains 206 and 207 are aligned with each other and constitute the main crystallographic orientation of the a axis in the buffer layer. On the other hand, the orientations of the a axes of the domain 208 and the domain 209 are each slightly in-plane rotated with respect to the orientations of the a axes of the domains 206 and 207.

The above-described deviation from the dominant crystallographic orientation on the whole is called mosaic spread. In particular, the deviation of the crystallographic orientation in the direction perpendicular to the substrate is referred to as the tilt mosaic orientation while the deviation of the crystallographic orientation in the in-plane direction is referred to as the twist mosaic spread. Generally, the tilt or twist mosaic spread indicates incompleteness of the orientation, and has therefore been known that the smaller mosaic spread is better. Here, the magnitude of the tilt or twist mosaic spread can be evaluated by performing x-ray rocking curve (XRC) measurement on a specific lattice plane (a symmetry plane) formed in parallel with the surface of the substrate or on a specific lattice plane formed perpendicularly to the surface of the substrate, and investigating a full width at half maximum (FWHM) of a diffraction peak thus obtained.

Here, FIGS. 2A and 2B and the above descriptions are intended to conceptually and clearly explain the tilt or twist mosaic spread, but are not intended to guarantee strictness. For example, the dominant crystallographic orientation on the whole in the direction perpendicular to the substrate or the dominant crystallographic orientation on the whole in the in-plane direction may not always coincide completely with the orientation of the c axis or the a axis of the sapphire substrate. Meanwhile, an interstice between a crystal and another crystal as illustrated in FIGS. 2A and 2B may not always be provided. What is important is that the mosaic spread indicates the degree of the deviation from the dominant crystallographic orientation.

Figure 3A:
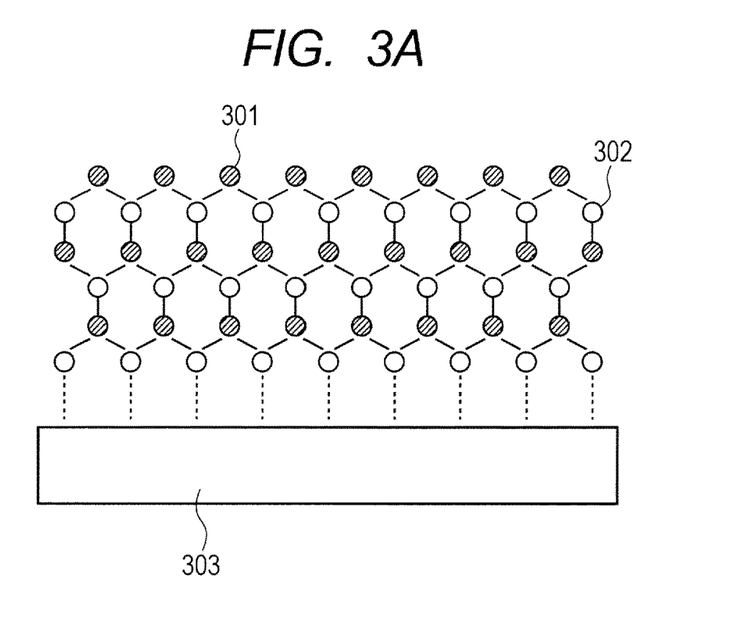
FIG. 3A is a conceptual diagram explaining +c polarity in the buffer layer according to the present invention.
Figure 3B:
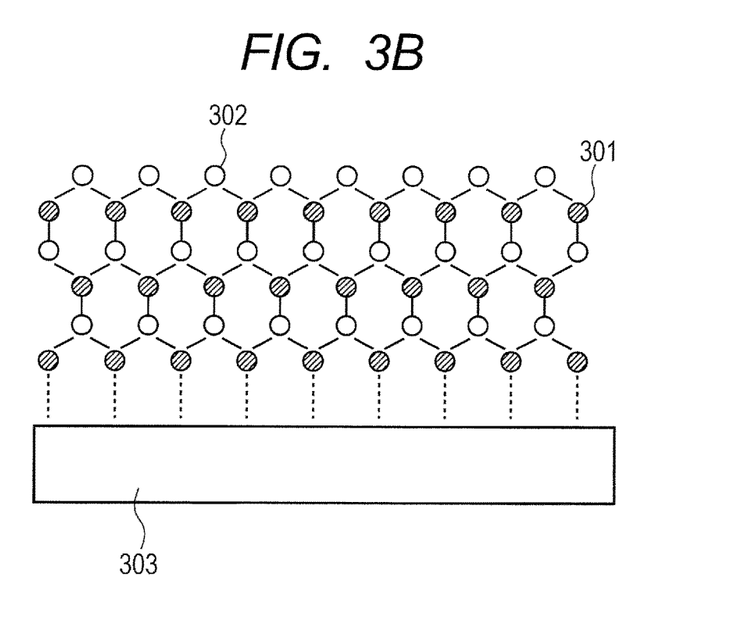
FIG. 3B is a conceptual diagram explaining −c polarity in the buffer layer according to the present invention.

Next, a concept of polarity in the buffer layer will be described by using FIGS. 3A and 3B. FIG. 3A shows an aspect in which the buffer layer is formed with the +c polarity while FIG. 3B shows an aspect in which the buffer layer is formed with the −c polarity. It is to be noted, however, that illustration of any of C, Si, Ge, Mg, Zn, Mn, and Cr contained in the buffer layer is omitted. In FIGS. 3A and 3B, reference numeral 301 denotes an Al or Ga atom, reference numeral 302 denotes an N atom, and reference numeral 303 denotes a sapphire substrate. When the buffer layer of the +c polarity is compared with the buffer layer of the −c polarity, lattice positions of the Al or Ge atoms switch places with lattice positions of the N atoms. Such polarity is also present in the group III nitride semiconductor thin film of the wurtzite crystal structure. In general, the group III nitride semiconductor thin film of the +c polarity is more likely to have higher crystalline quality than that of the group III nitride semiconductor thin film of the −c polarity. Moreover, the state of the polarity possessed by the buffer layer is likely to be inherited from the buffer layer to the foundation layer made of the group III nitride semiconductor thin film. Therefore, it is desirable to obtain the buffer layer of the +c polarity. However, it is also possible to grow the foundation layer in such a way as not to inherit the state of the orientation of the −c polarity included in the buffer layer by improving the film forming method and film forming conditions for the foundation layer made of the group III nitride semiconductor thin film as described previously. Accordingly, it is not always essential to form the buffer layer with the +c polarity.

As described above, in this embodiment, the buffer layer having at least any one of the wurtzite crystal structures of $Al_xGa_{1-x}N$:C, $Al_xGa_{1-x}N$:Si, $Al_xGa_{1-x}N$:Ge, $Al_xGa_{1-x}N$:Mg, $Al_xGa_{1-x}N$:Zn, $Al_xGa_{1-x}N$:Mn, and $Al_xGa_{1-x}N$:Cr (where $0 \leq x \leq 1$, and the percentage of any of the substances C, Si, Ge, Mg, Zn, Mn, and Cr to the entire buffer layer is equal to or below 5 at %) is formed on the sapphire substrate by the sputtering. Thus, it is possible to obtain the buffer layer which is lattice relaxed on the surface of the buffer layer as compared to the buffer according to the publicly known technique. In addition, it is possible to obtain the buffer layer having the orientation equivalent to that of the buffer layer according to the publicly known technique. By forming the foundation layer made of the group III nitride semiconductor thin film on the buffer layer, the foundation layer having the small film thickness of about 2 μm can achieve the threading dislocation density which is equivalent to that of the foundation layer having the film thickness of 5 μm according to the publicly known technique. In other words, it is possible to maintain fine crystallinity of the 2-μm foundation layer. As a consequence, it is possible to obtain the high-quality group III nitride semiconductor thin film at high productivity while reducing the time required for the film formation.

EXAMPLE 1

An example of forming the buffer layer made of AlN:Si on the sapphire substrate by using the sputtering apparatus S of FIG. 1, and then forming the foundation layer made of the group III nitride semiconductor thin film by the MOCVD will be described as the embodiment of the present invention. Although the buffer layer made of AlN:Si is used in this example, the same effects can also be obtained by using a different buffer layer (the buffer layer having at least any one of the wurtzite crystal structures of $Al_xGa_{1-x}N:C$, $Al_xGa_{1-x}N:Si$, $Al_xGa_{1-x}N:Ge$, $Al_xGa_{1-x}N:Mg$, $Al_xGa_{1-x}N:Zn$, $Al_xGa_{1-x}N:Mn$, and $Al_xGa_{1-x}N:Cr$ (where $0 \leq x \leq 1$, and the percentage of any of the substances C, Si, Ge, Mg, Zn, Mn, and Cr to the entire buffer layer is equal to or below 5 at %)).

First, the buffer layer made of AlN:Si is formed on the sapphire substrate under the following conditions by using the sputtering apparatus S of FIG. 1. Note that the film forming conditions for the buffer layer of this example are the same as the conditions in Patent Document 1 except for the target.

Substrate: (0001) sapphire
Substrate cleaning: cleaning by using hydrofluoric acid and an organic solvent
Presence and absence of plasma treatment: present and absent
Substrate temperature during plasma treatment: 500° C.
Pressure during plasma treatment: 1.0 Pa
Process gas used in plasma treatment: $N_2$
RF bias power during plasma treatment: 50 W
The number of times of dummy discharge: 0 times and 16 times
Attained pressure before film formation: $1.0 \times 10^{-5}$ Pa or below
Target used for film formation: Al:Si (Si concentration: 0.5%)
Substrate temperature during film formation: 500° C.
Pressure during film formation: 0.5 Pa
Process gases used in film formation: Ar+$N_2$ (Ar: 5 sccm, N2: 15 sccm)
RF power during film formation: 2000 W When the buffer layer made of AlN:Si is formed in the thickness of 40 nm under the conditions described above, the FWHM by the XRC on (0002) plane and (10-10) plane of the AlN:Si are about 0.1° and about 1.4°, respectively. Moreover, in-plane XRD measurement at a small incident angle (incident angle: 0.1°) is performed in order to estimate interplanar spacing of the (10-10) plane of AlN:Si. As a consequence, the in-plane lattice constant in the vicinity of the surface turns out to be 3.107 A. Hence, the value of the in-plane lattice constant at the surface portion is almost equal to that of bulk AlN. Furthermore, in order to estimate the in-plane lattice constant at the interface between AlN:Si and the sapphire substrate, the buffer layer is formed in the thickness of 10 nm by using the above-described method, and the in-plane lattice constant thereof is investigated by performing the in-plane XRD measurement at the small incident angle. As a consequence, the in-plane lattice constant turns out to be about 3.072 A. From these data, the AlN:Si film is thought to be lattice relaxed from the interface side between AlN:Si and the sapphire substrate toward the AlN:Si surface side.

Next, the foundation layer made of GaN in the thickness of 2 μm is formed by the MOCVD on the above-described AnN:Si buffer layer in the thickness of 40 nm. The threading dislocation density of the obtained foundation layer is estimated to be about $3.5 \times 10^8$ cm$^{-2}$ by cathode luminescence. Moreover, when the plasma treatment is present as for the condition on the presence and absence of the plasma treatment before formation of the buffer layer in this example, the buffer layers are formed by setting the number of times of the dummy discharge according to the publicly known technique to 0 times and 16 times, respectively. Here, no significant difference is observed in terms of the film quality of the buffer layers or the film quality of the foundation layer made of GaN and formed thereon.

COMPARATIVE EXAMPLE 1

Next, a verification test of the invention disclosed in Patent Document 1 was conducted as a comparative example. In this comparative example, a buffer layer made of AlN was formed on a sapphire substrate by using a sputtering apparatus having a configuration similar to that of a sputtering apparatus described in FIG. 5 of Patent Document 1. Then, foundations layers made of GaN in the thicknesses of 2 μm and 5 μm were formed by the MOCVD. Here, film forming conditions for the buffer layer made of AlN are similar to the film forming conditions disclosed in Patent Document 1, which are the same as the film forming conditions for the buffer layer of Example 1. Furthermore, film forming conditions for the foundation layers made of GaN and formed by the MOCVD are similar to those of Example 1.

The buffer layer made of the AlN which is formed in this comparative example contains less than 1% of oxygen. The orientation at 40 nm and the in-plane lattice constant at 10 nm are almost equal to those in Example 1. On the other hand, the in-plane lattice constant at 40 nm is not significantly different from the in-plane lattice constant at 10 nm. Accordingly, there is very little lattice relaxation. When the foundations layers made of GaN films are formed in the thicknesses of 2 μm, 5 μm, and 8 μm on the buffer layer by the MOCVD, the threading dislocation densities thereof turned out to be about $1 \times 10^9$ cm$^{-2}$, about $5 \times 10^8$ cm$^{-2}$, and about $3.5 \times 10^8$ cm$^{-2}$, respectively. That is to say, it is made clear that, despite the small film thickness of 2 μm, the foundation layer of Example 1 has achieved the threading dislocation density equivalent to that of the foundation layer of Comparative Example 1 having the film thickness of 8 μm.

As described above, by using the buffer layer according to the embodiment of the present invention, the foundation layer made of the GaN film and having the film thickness of less than 5 μm can still achieve the crystalline quality which is equivalent to GaN in the thickness equal to or above 5 μm formed in accordance with the technique disclosed in Patent Document 1. As a consequence, the group III nitride semiconductor can be obtained at high crystalline quality and at high productivity. Here, if the foundation layer made of GaN and having the thickness of 8 μm is formed on the buffer layer obtained by the embodiment of the present invention, the thread dislocation density thereof is equal to about $1.5 \times 10^8$ cm$^{-2}$. Thus, a group III nitride semiconductor thin film having even higher crystalline quality is obtained. However, productivity is reduced in this case. Accordingly, this group III nitride semiconductor thin film may possibly be used for manufacturing an ultrahigh-specification LED or the like, which requires an especially low threading dislocation density.

The invention claimed is:

1. A film forming method comprising the steps of:
a first step of forming a buffer layer by a sputtering method so as to contact a sapphire substrate held on a substrate holder in a vacuum chamber, said buffer layer having $Al_xGa_{1-x}N$ ($0 \leq x \leq 1$) as a main material and including an epitaxial film having a wurtzite structure; and
a second step of forming a foundation layer that includes a group III nitride semiconductor thin film,
wherein the first step includes:
preparing a target by homogeneously dispersing at least one substance selected from the group consisting of C, Si, Ge, Mg, Zn, Mn, and Cr at a concentration equal to or below 5 at % into at least one of Al metal and an AlGa alloy;
holding the sapphire substrate by a substrate mounting mechanism made of an insulating material at an outer peripheral portion of the substrate mounting mechanism to obtain a buffer layer of +c polarity, and heating the sapphire substrate to a desired temperature by the heater placed below the substrate mounting mechanism, while generating a plasma in the vacuum chamber by introducing at least one of a rare gas and a nitrogen-containing gas in the vacuum chamber and supplying a power to the target; and
forming the buffer layer on the sapphire substrate by sputtering the target in the plasma,
wherein the buffer layer formed by the forming step has a ratio of +c polarity higher than a ratio of −c polarity and includes the at least one substance selected from the group consisting of inter-lattice impurities of C, Si, Ge, Mg, Zn, Mn, and Cr that enters a lattice interstice of the wurtzite structure but does not enter a lattice point of the wurtzite structure, and
wherein the second step includes forming the foundation layer so as to contact the buffer layer.

2. The film forming method according to claim 1, wherein the buffer layer is formed on the sapphire substrate in a state where the sapphire substrate is held at a predetermined distance from a substrate-facing surface of the substrate holder.

3. The film forming method according to claim 1, wherein a percentage of the at least one substance selected from the group consisting of C, Si, Ge, Mg, Zn, Mn, and Cr in the buffer layer is equal to or below 5 at %.

4. The film forming method according to claim 1, wherein a film thickness of the foundation layer is below 5 µm.

5. A method of manufacturing a semiconductor light-emitting element comprising the steps of:
forming a buffer layer on a sapphire substrate by sputtering, the buffer layer including an epitaxial film having a wurtzite structure;
forming a foundation layer on the buffer layer; and
forming a light-emitting layer on the foundation layer,
wherein the buffer layer is formed by the film forming method according to claim 1.

6. A semiconductor light-emitting element comprising the buffer layer formed by the film forming method according to claim 1.

7. An illuminating device comprising the semiconductor light-emitting element according to claim 6.

8. The film forming method according to claim 1, wherein the forming the buffer layer is performed such that a ratio of +c polarity is higher than −c polarity in a vicinity of a surface of the buffer layer.

9. The film forming method according to claim 1, wherein the step of preparing includes homogeneously dispersing at least one substance selected from the group consisting of C, Si, Ge, Mg, Zn, Mn, and Cr at a concentration equal to or below 5 at % into an AlGa alloy to prepare a sputtering target.

* * * * *